US006087707A

United States Patent [19]

Lee et al.

[11] Patent Number: 6,087,707

[45] Date of Patent: *Jul. 11, 2000

[54] STRUCTURE FOR AN ANTIFUSE CELL

[75] Inventors: Roger Lee; Fernando Gonzalez, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/632,912

[22] Filed: Apr. 16, 1996

[51] Int. Cl.[7] ........ H01L 29/00

[52] U.S. Cl. ........ 257/530

[58] Field of Search ........ 257/530

[56] References Cited

U.S. PATENT DOCUMENTS

| | | | |
|---|---|---|---|
| 4,146,902 | 3/1979 | Tanimoto et al. | 257/530 |
| 4,424,578 | 1/1984 | Miyamoto | 257/530 |
| 4,599,705 | 7/1986 | Holmberg et al. | 257/530 |
| 4,605,872 | 8/1986 | Rung | 257/530 |
| 5,086,331 | 2/1992 | Hartgring et al. | 257/530 |
| 5,316,971 | 5/1994 | Chiang et al. | 257/530 |
| 5,619,063 | 4/1997 | Chen et al. | 257/530 |
| 5,682,049 | 10/1997 | Nguyen | 257/530 |

*Primary Examiner*—Tom Thomas
*Assistant Examiner*—Ori Nadav
*Attorney, Agent, or Firm*—Fletcher, Yoder & Van Someren

[57] ABSTRACT

A structure for an antifuse cell which comprises: (a) field oxide between the bottom plate of the antifuse element and its access transistor; and (b) an implanted region underlying the antifuse element to provide a conductive path between the source of the access transistor and the antifuse element.

26 Claims, 1 Drawing Sheet

STRUCTURE FOR AN ANTIFUSE CELL

FIELD OF THE INVENTION

The present invention relates to antifuses which are used in integrated circuit products, and, in particular, the cell structure for such antifuse elements.

DESCRIPTION OF THE PRIOR ART

Contemporary integrated circuit memories, e.g., dynamic random access memories (DRAMs), require a high degree of redundancy in order to improve manufacturing yields. Present redundancy techniques in DRAMs include providing extra memory array columns and/or extra memory array rows which can be used to replace defective columns and/or rows.

Antifuse elements have been used as nonvolatile programmable memory elements to store logic states which could then be used in DRAMs for row and column redundancy implementation. Antifuses may also be used in integrated circuit memories as a mechanism for changing the operating mode of the memory or to encode identification information about the memory, e.g., fabrication date.

Several shortcomings exist with respect to the structure of prior art antifuse cells. First, such cells typically have included a polysilicon layer which forms the top plate of the antifuse element in the cell and which overlies an implanted region in the substrate forming the bottom plate. A dielectric exists between these two plates. The bottom plate of the antifuse element is contiguous with and comprises the source of the access transistor for the antifuse cell. When the polysilicon comprising the upper plate is etched, the etching process tends to undercut the polysilicon and damage the antifuse dielectric. If etching results in damage to the antifuse dielectric, a path from the polysilicon top plate to the implanted bottom plate may be formed, causing the antifuse element to short out or causing the antifuse element to exhibit leakage. Also, the junction of the bottom plate and substrate 12 is susceptible to not being able to withstand the programming voltage applied to the antifuse element.

The shortcomings of the prior art structure have been overcome by the structure of the present invention.

SUMMARY OF THE INVENTION

In accordance with the present invention, an antifuse cell is provided wherein field oxide is interposed between the antifuse element and its access transistor. The etching of the polysilicon top plate of the antifuse element is performed over this field oxide, and any degradation of the antifuse material that may occur from this etching is over this field oxide area, and does not affect the antifuse material area over the impurity region comprising the bottom plate of the antifuse cell.

In accordance with the present invention, a second impurity region is formed in the substrate underlying the impurity region forming the bottom plate of the antifuse element. This second impurity region connects the bottom plate of the antifuse element to the source of the access transistor. This second impurity region has a sufficiently high breakdown voltage, such that the application of the programming voltage to the bottom plate of the antifuse element does not result in breakdown or leakage to the substrate.

DESCRIPTION OF SPECIFIC EMBODIMENTS

It will be appreciated that the present invention can take many forms and embodiments. Some embodiments of the invention are described so as to give an understanding of the invention. It is not intended, however, that the embodiments of the present invention that are described in this specification should limit the invention.

Figure 1:
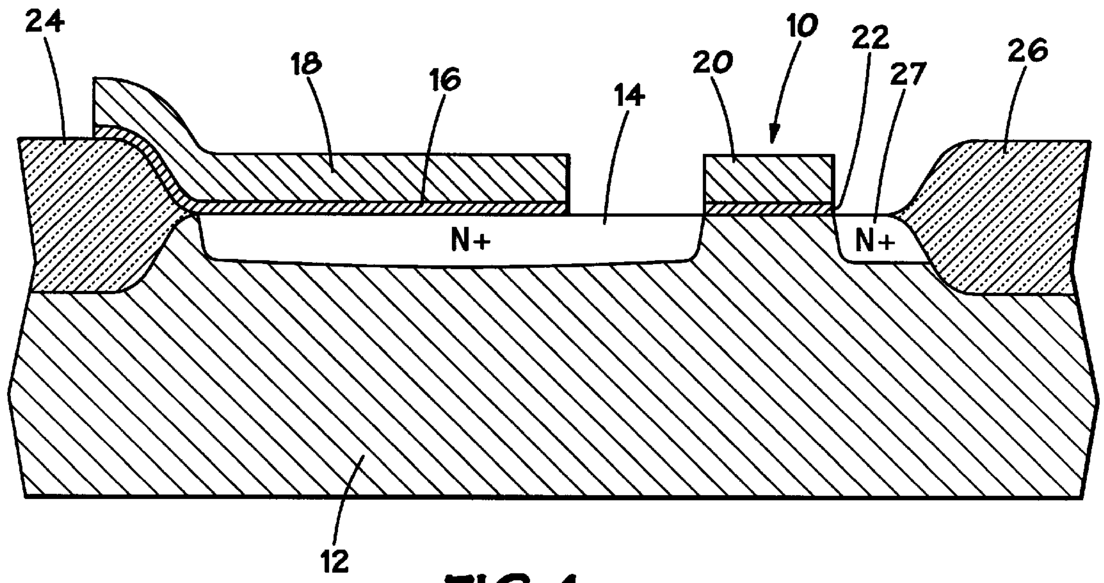
FIG. 1 is a cross-sectional view of a portion of an integrated circuit showing the structure of a prior art antifuse element.

Before discussing embodiments of the present invention, it is appropriate to consider the structure of prior art antifuse cells. With reference therefore to FIG. 1, there is shown the structure of an antifuse cell according to the prior art. The bottom plate of the antifuse element is N+ region 14, while the top plate is polysilicon layer 18. Interposed between those two plates is a dielectric 16, which may, for example, be an ONO dielectric composed of a native oxide layer, a silicon nitride layer and an upper oxide layer. The N+ region 14 is contiguous with and forms the source of access transistor 10. The drain of access transistor 10 comprises N+ region 27, and the gate of access transistor 10 comprises polysilicon gate 20. Interposed between the gate 20 and the substrate 12 is gate oxide 22. Field oxide sections 24, 26 are formed at the perimeter of the antifuse cell as shown in FIG. 1.

Figure 2:
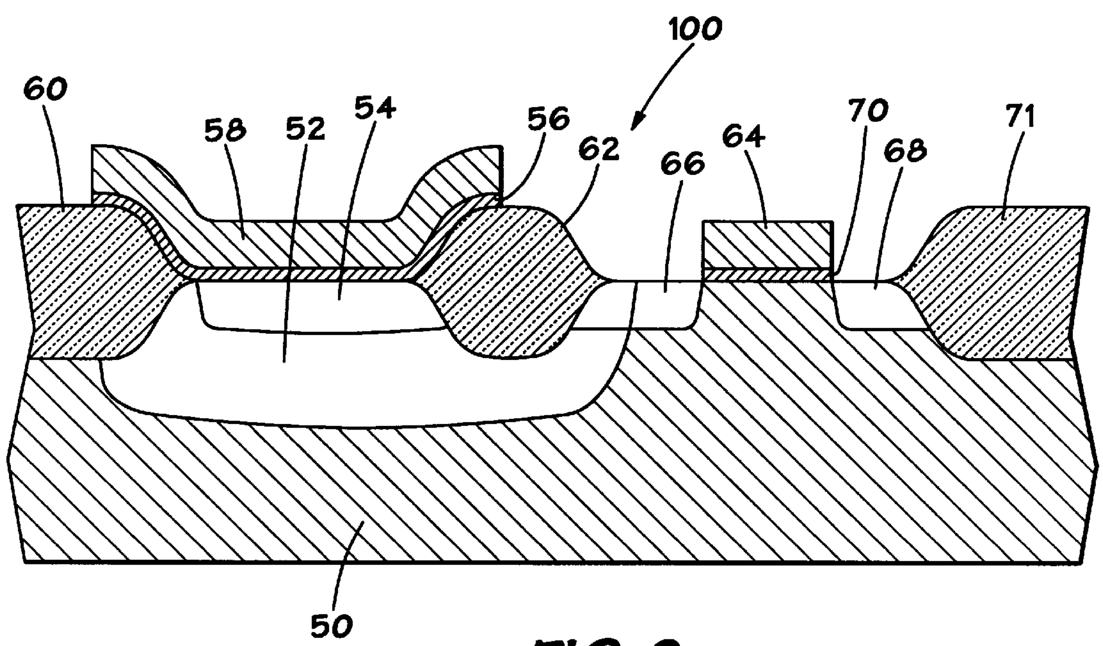
FIG. 2 is a cross-sectional drawing of an integrated circuit which depicts the structure of an antifuse element in accordance with the present invention.

With reference now to FIG. 2, the structure of an antifuse cell 100 in accordance with the present invention is illustrated. The antifuse cell comprises an antifuse element having a top plate 58, an antifuse material 56 and a bottom plate 54. Top plate 58 is preferably made of a polysilicon material, and antifuse material 56 is preferably the ONO dielectric structure described above, but could be amorphous silicon material. The bottom plate 54 of the antifuse element is an impurity region 54 which is formed in substrate 50. Preferably, impurity region 54 is formed by implanting N+ material into substrate 50.

Adjacent to the antifuse element of FIG. 2 is an access transistor. This access transistor comprises: impurity regions 66, 68 forming the source and drain, respectively, of the access transistor; gate 64, which is preferably made of a polysilicon material; and gate oxide 70. Impurity regions 66, 68 are of the same conductivity type as bottom plate 54 are preferably N+ regions that are formed in the substrate 50 by ion implantation techniques. Interposed between the access transistor and the antifuse element is field oxide 62.

A second impurity region 52 is formed in the substrate 50 under the impurity region 54 and extends to the source 66 of the access transistor. Since the impurity region 54 and the source and drain of the access transistor are preferably implanted N+ regions, the second impurity region is preferably an implanted N-well. N-well 52 thus provides a conduction path between the N+ region comprising between bottom plate 54 and the N+ region comprising the source 66 of the access transistor. N-well 52 could also be implanted with a shallow implant of Arsenic to lower its resistance. Typical, but not exclusive doping levels of bottom plate 54 and N-well 52 follow: bottom plate 54 can range from 1E18 to 1E21 atoms/cm3; N-well 52 can range from 1E16 to 1E17 atoms/cm3. Impurity regions 66, 68 can be doped to the same doping levels as the N-channel CMOS transistors.

The cell structure of FIG. 2 has a number of advantages over the prior art antifuse cell. First, etching of the polysilicon 58 and antifuse material occurs over the field oxide 62. Any degradation of that antifuse material 56 as a result of this etching will thus occur over this field oxide. The portion of the antifuse material 56 over the impurity region comprising bottom plate 54 will not be affected by the etching.

Further, the second impurity region 52 underlying bottom plate 54 has a sufficiently high breakdown voltage such that application of the programming voltage to the bottom plate does not result in reverse-biased junction breakdown or leakage to the substrate.

While the preferred embodiment of the present invention has been described with respect to devices employing P-type substrates, those skilled in the art will appreciate the applicability of the present invention to devices employing N-type substrates. For instance, some relevant portion of substrate 50 could be doped N-type as in a large N-well, or an N-type substrate could be used. Then, P-well and P+ regions could be formed which would take place of the N-well 52 and bottom plate 54 respectively.

A method for manufacturing the antifuse cell shown is now disclosed that is compatible with the CMOS processing flows which are used to make the peripheral logic transistors on a chip. One of ordinary skill will realize that the following description of the antifuse cell incorporates well known manufacturing techniques and that many of the details have been left out. Starting a lightly P doped substrate, the N-wells 52 are formed. The N-well 52 used for the antifuse cells may be formed by the same N-well process that will ultimately be used to forms the P-channel CMOS transistors. Next, the field oxide 62 is formed. Thereafter, an N+ implant is used to create the bottom plate 54. A patterned nitride mask can be used to block the N+ implant where it is not desired. Next, the antifuse material 56 is deposited or grown. If the antifuse material 56 is suitable for use as a gate oxide for the access transistor (e.g., ONO or oxide), then the antifuse material 56 and gate oxide 70 can be the same. Furthermore top plate 58 and access transistor gate 64 can also be the same material, preferably polysilicon, and this layer is deposited over the antifuse material 56 and gate oxide 70. The polysilicon layer can then be etched to simultaneously form top plate 58 and access transistor gate 64, as shown in FIG. 2. Of course, one of ordinary skill will realize that the top plate 58 and access transistor gate 64 can also be formed out of different materials and etched independently. After both the top plate 58 and access transistor gate 64 are formed, the impurity regions 66, 68, which function as the source and drain of the access transistor, are formed by ion implantation, and are self aligned to the access transistor gate 64.

One of ordinary skill will realize that the antifuse cell herein disclosed could be used in a variety of different semiconductor devices, including memories and microprocessors, where a small bank of cells could be used for purposes of redundancy and chip identification. Also, the antifuse cell could be used as a memory cell in a memory array.

What is claimed is:

1. An antifuse cell for an integrated circuit, the antifuse cell comprising:

an access device formed on a substrate, the access device having a first doped region;

a field oxide region formed on the substrate adjacent the access device; and an antifuse formed on the substrate adjacent the field oxide region, the field oxide region being disposed between the access device and the antifuse, the antifuse having a second doped region, a third doped region, a programmable layer, and a conductive layer, the second doped region forming a bottom plate of the antifuse, the third doped region disposed beneath the entire second doped region and extending under the field oxide region and being coupled to the first doped region, the programmable layer being disposed over the second doped region and terminating above the field oxide region, and the conductive layer being disposed over the programmable layer.

2. The antifuse cell, as set forth in claim 1, wherein the programmable layer comprises dielectric material.

3. The antifuse cell, as set forth in claim 2, wherein the dielectric material comprises an ONO structure.

4. The antifuse cell, as set forth in claim 1, wherein the programmable layer comprises amorphous silicon.

5. The antifuse cell, as set forth in claim 1, wherein the first doped region and the second doped region are N doped.

6. The antifuse cell, as set forth in claim 1, wherein the conductive layer comprises polysilicon.

7. An antifuse cell for an integrated circuit, the antifuse cell comprising:

an access device formed on a substrate, the access device having a first doped region;

a field oxide region formed on the substrate adjacent the access device;

an antifuse formed on the substrate adjacent the field oxide region, the field oxide region being disposed between the access device and the antifuse, the antifuse having a bottom plate, a programmable layer disposed over the bottom plate, and a top plate disposed over the programmable layer, the programmable layer and the top plate terminating above the field oxide region; and a second doped region formed beneath the entire bottom plate and extending under the field oxide region to couple the first doped region to the bottom plate.

8. The antifuse cell, as set forth in claim 7, wherein the programmable layer comprises dielectric material.

9. The antifuse cell, as set forth in claim 8, wherein the dielectric material comprises an ONO structure.

10. The antifuse cell, as set forth in claim 7, wherein the programmable layer comprises amorphous silicon.

11. The antifuse cell, as set forth in claim 7, wherein the first doped region and the bottom plate are N+ doped.

12. The antifuse cell, as set forth in claim 7, wherein the second doped region is N− doped.

13. The antifuse cell, as set forth in claim 7, wherein the top plate comprises polysilicon.

14. An integrated circuit memory device comprising:

a memory array comprising a plurality of memory cells, at least a portion of the memory cells comprising:

an access device formed on a substrate, the access device having a first doped region;

a field oxide region formed on the substrate adjacent the access device; and an antifuse formed on the substrate adjacent the field oxide region, the field oxide region being disposed between the access device and the antifuse, the antifuse having a second doped region, a third doped region, a programmable layer, and a conductive layer, the second doped region forming a bottom plate of the antifuse, the third doped region disposed beneath the entire second doped region and extending under the field oxide region and being coupled to the first doped region, the programmable layer being disposed over the second doped region and terminating above the field oxide region, and the conductive layer being disposed over the programmable layer.

15. The memory device, as set forth in claim 14, wherein the programmable layer comprises dielectric material.

16. The memory device, as set forth in claim 15, wherein the dielectric material comprises an ONO structure.

17. The memory device, as set forth in claim 14, wherein the programmable layer comprises amorphous silicon.

18. The memory device, as set forth in claim 14, wherein the first doped region and the second doped region are N doped.

19. The memory device, as set forth in claim 14, wherein the conductive layer comprises polysilicon.

20. An integrated circuit memory device comprising:

a memory array comprising a plurality of memory cells, at least a portion of the memory cells comprising:

an access device formed on a substrate, the access device having a first doped region;

a field oxide region formed on the substrate adjacent the access device;

an antifuse formed on the substrate adjacent the field oxide region, the field oxide region being disposed between the access device and the antifuse, the antifuse having a bottom plate, a programmable layer disposed over the bottom plate, and a top plate disposed over the programmable layer, the programmable layer and the top plate terminating above the field oxide region; and a second doped region formed beneath the entire bottom plate and extending under the field oxide region to couple the first doped region to the bottom plate.

21. The memory device, as set forth in claim 20, wherein the programmable layer comprises dielectric material.

22. The memory device, as set forth in claim 21, wherein the dielectric material comprises an ONO structure.

23. The memory device, as set forth in claim 20, wherein the programmable layer comprises amorphous silicon.

24. The memory device, as set forth in claim 20, wherein the first doped region and the bottom plate are N+ doped.

25. The memory device, as set forth in claim 20, wherein the second doped region is N− doped.

26. The memory device, as set forth in claim 20, wherein the top plate comprises polysilicon.

* * * * *